United States Patent
Furuie et al.

(10) Patent No.: US 6,756,623 B2
(45) Date of Patent: Jun. 29, 2004

(54) SEMICONDUCTOR DEVICE AND METHOD OF DRIVING TRANSISTORS

(75) Inventors: Toshiyuki Furuie, Tokyo (JP); Nobuhisa Honda, Fukuoka (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 57 days.

(21) Appl. No.: 10/123,153

(22) Filed: Apr. 17, 2002

(65) Prior Publication Data

US 2003/0075748 A1 Apr. 24, 2003

(30) Foreign Application Priority Data

Oct. 19, 2001 (JP) ........................................ 2001-322159

(51) Int. Cl.[7] .......................................... H01L 27/108
(52) U.S. Cl. .................... 257/296; 257/68; 257/300; 327/379; 327/380; 327/381; 327/360; 327/374; 327/198; 327/108
(58) Field of Search .......................... 257/296, 68, 300; 327/379, 380, 381, 360, 374, 198, 108

(56) References Cited

U.S. PATENT DOCUMENTS

| | | | | |
|---|---|---|---|---|
| 5,818,281 A | * | 10/1998 | Ohura et al. | 327/381 |
| 5,986,484 A | * | 11/1999 | Kimata | 327/108 |
| 6,285,235 B1 | * | 9/2001 | Ichikawa et al. | 327/374 |
| 6,459,324 B1 | * | 10/2002 | Neacsu et al. | 327/379 |
| 6,531,895 B1 | * | 3/2003 | Barrett et al. | 326/82 |

FOREIGN PATENT DOCUMENTS

| | | |
|---|---|---|
| JP | 2-7617 | 1/1990 |
| JP | 8-163862 | 6/1996 |

* cited by examiner

*Primary Examiner*—Nathan J. Flynn
*Assistant Examiner*—Remmon R. Fordé
(74) *Attorney, Agent, or Firm*—Oblon, Spivak, McClelland, Maier & Neustadt, P.C.

(57) ABSTRACT

When a driving unit (100) charges gate input capacitance (6) of an IGBT (7), the gate input capacitance (6) accumulates electric charges which are accumulated therein when the driving unit (100) discharges the gate input capacitance (6). Therefore, it is possible to reduce the amount of electric charges to be supplied to the gate input capacitance (6) by the driving unit (100) until the charge of the gate input capacitance (6) is completed. As a result, it is possible to reduce the required power capacity of a control power supply (15a). Further, since the electric charges accumulated in the gate input capacitance (6) are effectively used, it is possible to ensure power savings of a semiconductor device. Thus provided are a semiconductor device and a method of driving a transistor, in which electric charges accumulated in gate input capacitance of an insulated gate transistor are effectively utilized, to reduce required power capacity of a power supply for driving the transistor and ensure power savings of the semiconductor device on the whole.

15 Claims, 9 Drawing Sheets

F I G. 3
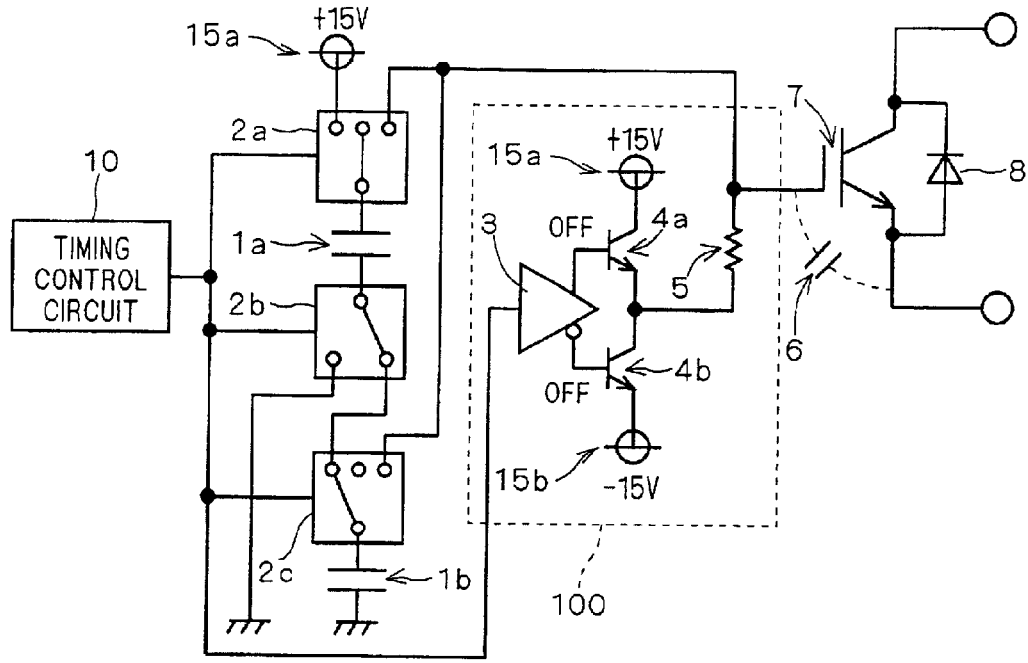
F I G. 4
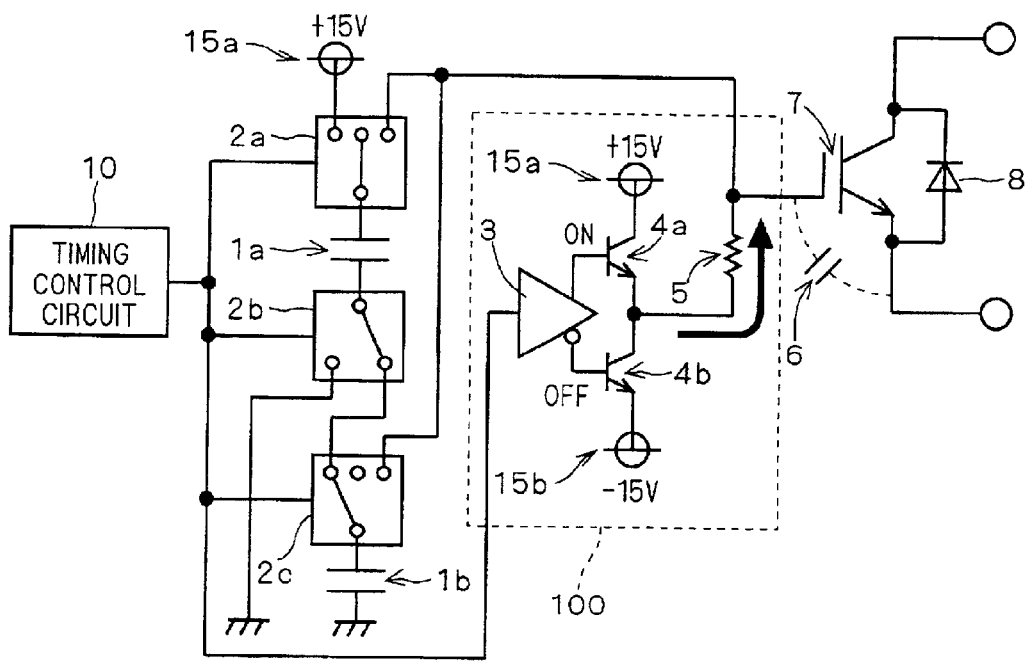

F I G. 1 1
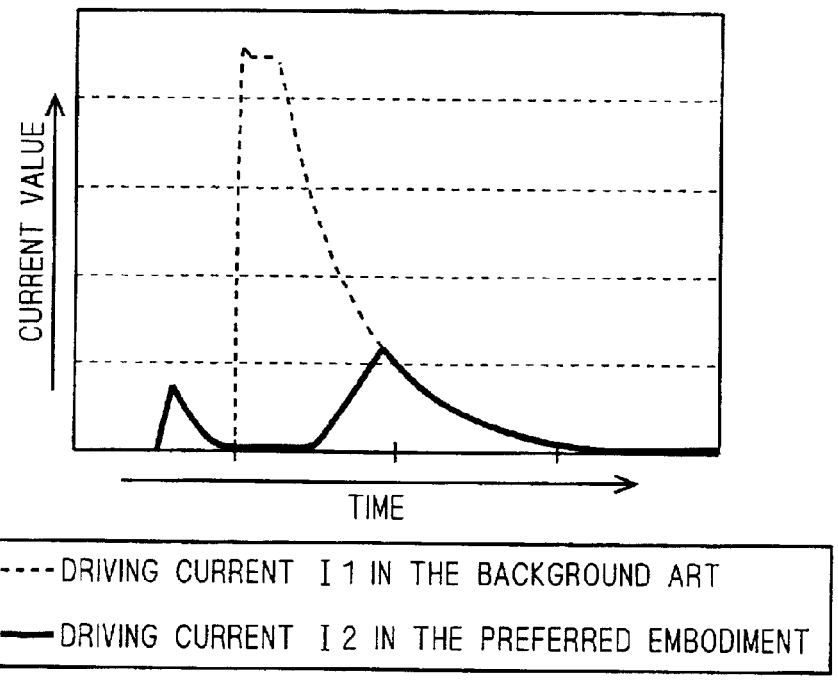
F I G. 1 2
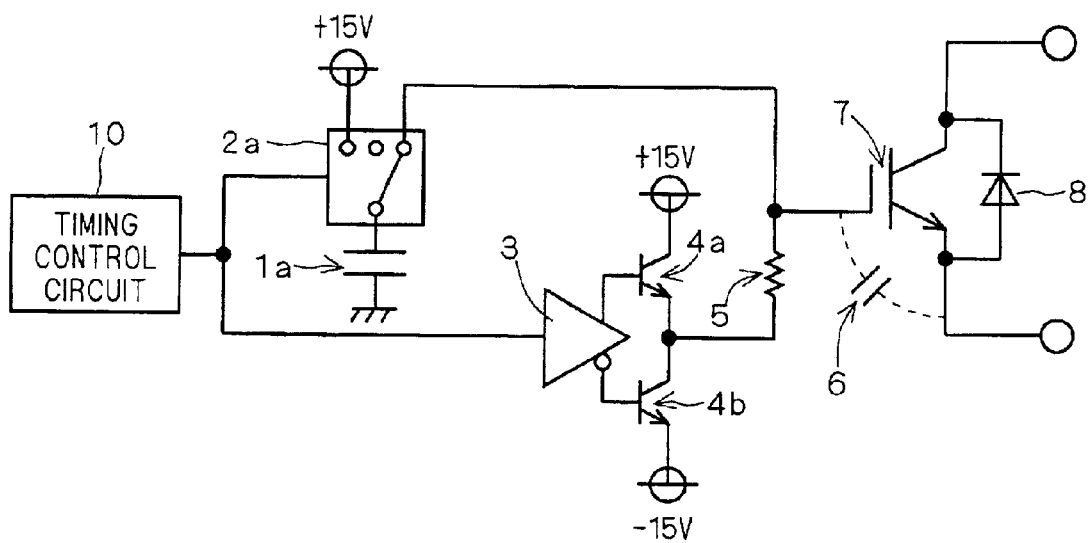

F I G. 1 4
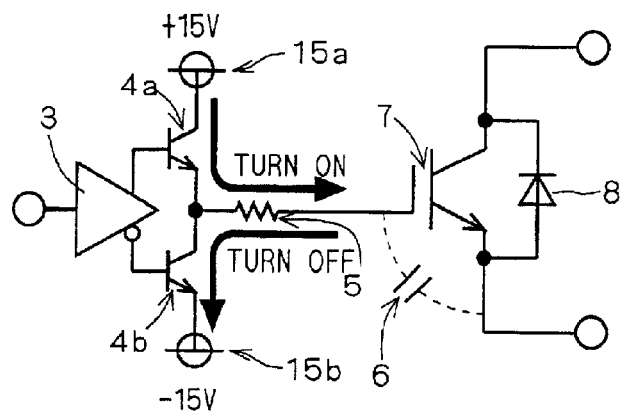
F I G. 1 5
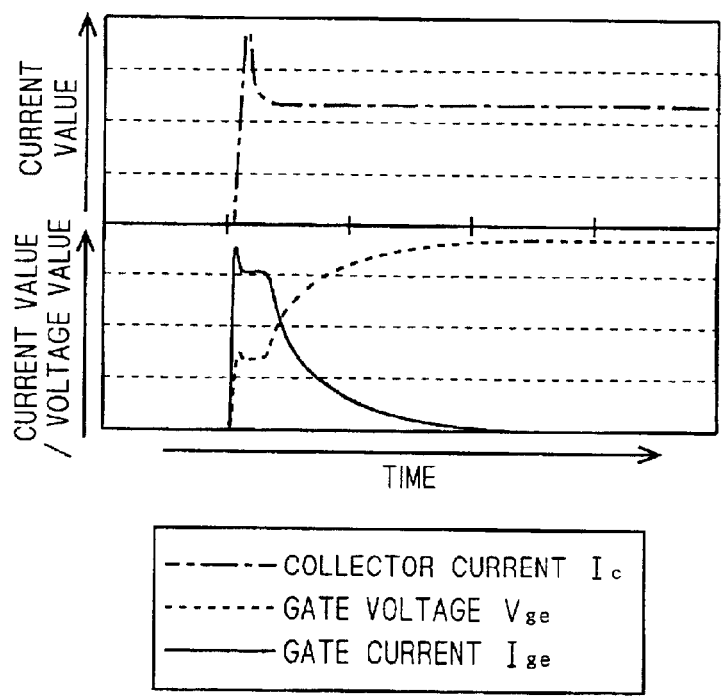

F I G. 16
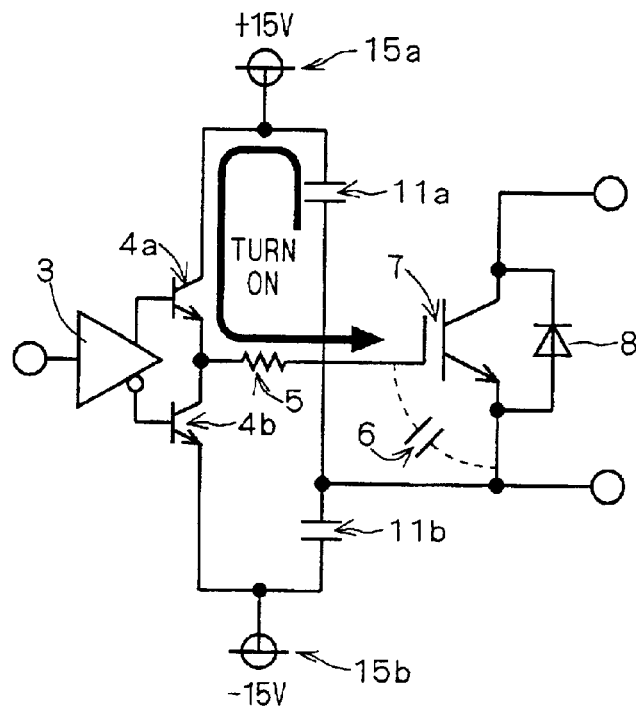
F I G. 17
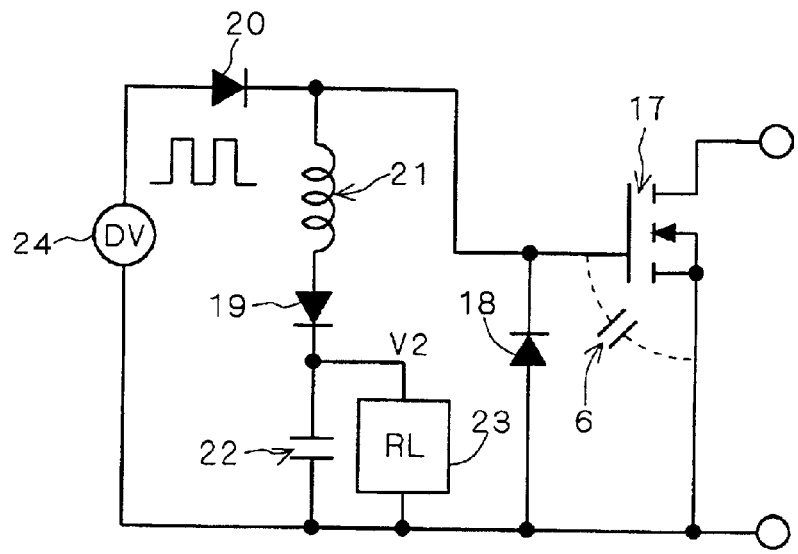

SEMICONDUCTOR DEVICE AND METHOD OF DRIVING TRANSISTORS

BACKGROUND OF THE INVENTION

1. Field of the Invention

The present invention relates to a semiconductor device, and more particularly to a semiconductor device which charges and discharges gate input capacitance of an insulated gate transistor and a method of driving the transistor.

2. Description of the Background Art

FIG. 14 is a view showing a configuration of a semiconductor device in a first background art. As shown in FIG. 14, the semiconductor device of the first background art comprises an IGBT (Insulated Gate Bipolar Transistor) 7 which is an insulated gate transistor, a protection diode 8 working against a reverse voltage applied between an emitter and a collector of the IGBT 7, a gate driving circuit 3, a control power supply 15a which outputs a voltage of +15 V, a control power supply 15b which outputs a voltage of −15 V, a transistor 4a having a collector connected to the control power supply 15a, a transistor 4b having an emitter connected to the control power supply 15b and a resistor 5. Gate input capacitance 6 is parasitic capacitance generated structurally between a gate and the emitter of the IGBT 7.

In the semiconductor device of FIG. 14, in order to turn the IGBT 7 on, first, the gate driving circuit 3 turns the transistor 4a on and turns the transistor 4b off. When the transistor 4a is turned on, the control power supply 15a supplies the gate of the IGBT 7 with the voltage of +15 V. At this time, since the gate input capacitance 6 is present between the gate and emitter of the IGBT 7, electric charges are supplied by the control power supply 15a to the gate input capacitance 6, thereby producing a gate current. As the gate input capacitance 6 is being charged, a gate voltage of the IGBT 7 increases and the IGBT 7 is turned on when the gate voltage of the IGBT 7 reaches a threshold voltage or more. After that, the charge of the gate input capacitance 6 of the IGBT 7 is completed, the gate voltage becomes about +15 V and the gate current almost stops flowing therein. Further, in some cases, the gate current flowing during a period from the start to end of the charge of the gate input capacitance 6 is simply referred to as "charging current".

When the IGBT 7 is turned off, the gate driving circuit 3 turns the transistor 4a off and turns the transistor 4b on. When the transistor 4b is turned on, the control power supply 15b supplies the gate of the IGBT 7 with the voltage of −15 V. At this time, since the electric charges are accumulated in the gate input capacitance 6 of the IGBT 7, the electric charges are extracted by the control power supply 15b, thereby producing the gate current in a direction reverse to that of the case where the IGBT 7 is turned on. As the gate input capacitance 6 is being discharged, the gate voltage of the IGBT 7 decreases and the IGBT 7 is turned off when the gate voltage of the IGBT 7 becomes less than the threshold voltage. After that, the discharge of the gate input capacitance 6 of the IGBT 7 is completed, the gate voltage becomes about −15 V and the gate current almost stops flowing therein. Further, in some cases, the gate current flowing during a period from the start to end of the discharge of the gate input capacitance 6 is simply referred to as "discharging current".

FIG. 15 is a view showing a relation of the gate voltage $V_{ge}$, the gate current $I_{ge}$ and a collector current $I_C$ at the time when the IGBT 7 of FIG. 14 is turned on, and the gate current $I_{ge}$ corresponds to the charging current of the IGBT 7. As shown in FIG. 15, when the transistor 4a is turned on, the gate current $I_{ge}$ for charging the gate input capacitance 6 largely flows, in other words, the charging current largely flows, and after that, as the gate input capacitance 6 is being charged, in other words, as the gate voltage $V_{ge}$ increases, the gate current $I_{ge}$ decreases and when the gate voltage $V_{ge}$ becomes almost equivalent to the voltage outputted from the control power supply 15a, the gate current $I_{ge}$ almost stops flowing.

As discussed above, with the charging current supplied by the control power supply 15a, the IGBT 7 is turned on. In other words, the control power supply 15a needs power capacity to supply the charging current. Similarly, in order to turn the IGBT 7 off, the control power supply 15b needs power capacity to supply the discharging current. Then, in order to increase a rated current between the emitter and collector of the IGBT 7, it is usually necessary to increase the chip size of the IGBT 7, which leads to an increase of the gate input capacitance 6. For this reason, driving the IGBT 7 having a large rated current needs the control power supplies 15a and 15b having large power capacity. Further, when the IGBT 7 is used for an inverter device, as the operating frequency of the inverter device, i.e., the switching frequency of the IGBT 7 becomes higher, the charging current flowing per unit time becomes larger. For this reason, faster driving the IGBT 7 needs the control power supplies 15a and 15b having large power capacity. Thus, as the rated current of the IGBT 7 increases, and as faster driving of the IGBT 7 is desired, the power capacity of the control power supplies 15a and 15b required to drive the IGBT 7 increases.

The increase in power capacity of the control power supplies 15a and 15b as discussed above leads to an increase in cost and packaging volume of the control power supplies 15a and 15b. For this reason, in recent years when it is desired to reduce the cost and size of semiconductor devices, reduction of required power capacity of the control power supplies 15a and 15b is needed.

Then, a second background art is proposed, where the required power capacity of the control power supplies 15a and 15b are reduced. FIG. 16 is a view showing a configuration of a semiconductor device in the second background art. The semiconductor device of the second background art further comprises capacitors 11a and 11b besides the configuration of the first background art discussed above.

As shown in FIG. 16, when both the transistors 4a and 4b are in an off state, the capacitors 11a and 11b are charged by the control power supplies 15a and 15b. Then, in order to turn on the IGBT 7, when the gate driving circuit 3 turns the transistor 4a on and turns the transistor 4b off, electric charges accumulated in the capacitor 11a go through the transistor 4a to be supplied to the gate input capacitance 6 of the IGBT 7 where the supplied electric charges are accumulated. By the way, the gate current $I_{ge}$ of the IGBT 7 largely flows first when the transistor 4a is turned on and after that gradually decreases, as shown in FIG. 15. In short, the control power supply 15a of the first background art needs current supplying capability to produce the peak value of the gate current $I_{ge}$ as shown in FIG. 15. In the above-discussed second background art, since the electric charges accumulated in the capacitor 11a are supplied to the gate input capacitance 6 when the transistor 4a is turned on, the current supplied directly to the gate input capacitance 6 by the control power supply 15a decreases. For this reason, the control power supply 15a of the second background art does not need the current supplying capability to produce the peak value of the gate current $I_{ge}$ as shown in FIG. 15. In other words, it is possible to reduce the required power capacity of the control power supply 15a.

Further, in order to turn off the IGBT 7, when the gate driving circuit 3 turns the transistor 4a off and turns the transistor 4b on, the electric charges accumulated in the gate input capacitance 6 go through the transistor 4b to be supplied to the capacitor 11b. For this reason, like for the control power supply 15a, it is possible to reduce the required power capacity of the control power supply 15b. Furthermore, almost the same technique as the second background art shown in FIG. 16 is disclosed in, for example, Japanese Patent Application Laid-Open No. 2-7617.

In the second background art, however, since the capacitors 11a and 11b are charged by the control power supplies 15a and 15b, respectively, the total amount of electric charges supplied by the control power supplies 15a and 15b is not reduced when the IGBT 7 is turned on or off.

Then, a third background art is proposed, where energy accumulated in the gate input capacitance 6 of the IGBT 7 is effectively utilized to ensure power savings of a semiconductor device on the whole. FIG. 17 is a view showing a configuration of a semiconductor device in the third background art. As shown in FIG. 17, the semiconductor device of the third background art comprises a MOSFET 17 which is an insulated gate transistor, a pulse signal source 24 for applying a pulse signal to a gate of the MOSFET 17, diodes 18 to 20, an inductor 21, a load 23 and a capacitor 22 for providing energy to the load 23.

In the third background art shown in FIG. 17, the pulse signal source 24 applies a pulse signal to the gate of the MOSFET 17 through the diode 20, thereby switching the MOSFET 17. When the MOSFET 17 is in an off state, the gate input capacitance 6 of the IGBT 7 and the inductor 21 resonate, to move energy which is accumulated in the gate input capacitance 6 when the MOSFET 17 is in an on state to the capacitor 22 through the diode 19. Then, the energy accumulated in the capacitor 22 is supplied to the load 23. Thus, in the third background art, since the energy accumulated in the gate input capacitance 6 is reused, loss of the energy in the semiconductor device on the whole can be reduced to consequently ensure power savings of the semiconductor device on the whole. Further, almost the same technique as the third background art shown in FIG. 17 is disclosed in, for example, Japanese Patent Application Laid-Open No. 8-163862.

The third background art, however, is not a technique to reduce the required power capacity of a power supply to drive the MOSFET 17, like the control power supplies 15a and 15b, e.g., a power supply for the pulse signal source 24 and reduce the size of the power supply. Further, in order to quickly move the energy of the gate input capacitance 6 to the capacitor 22, it is necessary to resonate the gate input capacitance 6 and the inductor 21 and in order for that, it is necessary that the signals supplied from the pulse signal source 24 to the gate of the MOSFET 17 should have constant frequency and duty. For this reason, the semiconductor device shown in FIG. 17 can not operate the MOSFET 17 with an arbitrary switching frequency.

SUMMARY OF THE INVENTION

It is an object of the present invention to provide a semiconductor device and a method of driving a transistor, in which electric charges accumulated in gate input capacitance of an insulated gate transistor are effectively utilized to reduce required power capacity of a power supply to drive the transistor and ensure power savings of the semiconductor device on the whole.

According to a first aspect of the present invention, the semiconductor device includes an insulated gate transistor, a driving unit and a capacitor.

The driving unit produces charge and discharge of gate input capacitance of the insulated gate transistor, and the capacitor is linked to the charge and the discharge produced by the driving unit to be selectively connected to a gate of the insulated gate transistor.

The capacitor is linked to the discharge produced by the driving unit to be connected to the gate, whereby the gate input capacitance supplies the capacitor with electric charges accumulated therein and the capacitor accumulates therein the electric charges supplied from the gate input capacitance.

The capacitor is linked to the charge produced by the driving unit to be connected to the gate, whereby the capacitor supplies the gate input capacitance with the electric charges accumulated therein and the gate input capacitance accumulates therein the electric charges supplied from the capacitor.

In the semiconductor device according to the first aspect, since the capacitor is linked to the discharge of the gate input capacitance provided by the driving unit to be connected to the gate of the insulated gate transistor, when the capacitor is connected to the gate of the transistor in advance of the discharge of the gate input capacitance produced by the driving unit, for example, the gate input capacitance supplies the capacitor with the electric charges accumulated therein and the capacitor accumulates therein the electric charges supplied from the gate input capacitance in advance of the charge of the gate input capacitance produced by the driving unit. Further, since the capacitor is linked to the charge of the gate input capacitance produced by the driving unit to be connected to the gate of the insulated gate transistor, when the capacitor is connected to the gate of the transistor in advance of the charge of the gate input capacitance produced by the driving unit, for example, the capacitor supplies the gate input capacitance with the electric charges accumulated therein and the gate input capacitance accumulates therein the electric charges supplied from the capacitor. As a result, when being charged by the driving unit, the gate input capacitance of the insulated gate transistor eventually accumulates the electric charges which are accumulated therein at the time of the discharge of the gate input capacitance produced by the driving unit. Therefore, since the electric charges are accumulated in the gate input capacitance to some degree when the driving unit begins charging the gate input capacitance, it is possible to reduce the amount of electric charges to be supplied to the gate input capacitance by the driving unit until the charge of the gate input capacitance is completed. As a result, it is possible to reduce the required power capacity of the power supply to allow the driving unit to supply the gate input capacitance with the electric charges.

Furthermore, since part of the electric charges which are accumulated in the gate input capacitance of the insulated gate transistor at the time of the discharge thereof are used to charge the gate input capacitance, in other words, the electric charges accumulated in the gate input capacitance are effectively used, it is possible to ensure power savings of the semiconductor device.

According to a second aspect of the present invention, the method of driving the transistor includes the steps of (a) and (b). In the step (a) discharge of gate input capacitance in an insulated gate transistor is produced, and in the step (b) charge of the gate input capacitance is produced.

The step (a) includes the steps of (c) and (d). In the step (c) electric charges accumulated in the gate input capacitance are supplied to the capacitor and the electric charges supplied by the gate input capacitance are accumulated in the capacitor, and in the step (d) electric charges remaining in the gate input capacitance are extracted after the step (c).

The step (b) includes the steps of (e) and (f). In the step (e) electric charges accumulated in the capacitor are supplied to the gate input capacitance and the electric charges supplied by the capacitor are accumulated in the gate input capacitance after the step (d), and in the step (f) further electric charges are supplied to the gate input capacitance after the step (e).

In the method of driving a transistor according to the second aspect, when being charged by the driving unit, the gate input capacitance of the insulated gate transistor eventually accumulates the electric charges which are accumulated therein before the discharge of the gate input capacitance. Therefore, since the electric charges are accumulated in the gate input capacitance to some degree when the step (f) is executed, it is possible to reduce the amount of electric charges to be supplied to the gate input capacitance until the charge of the gate input capacitance is completed. As a result, it is possible to reduce the required power capacity of the power supply to supply the gate input capacitance with the electric charges in the step (f).

Further, since part of the electric charges which are accumulated in the gate input capacitance of the insulated gate transistor at the time of the discharge thereof are used to charge the gate input capacitance, it is possible to effectively use the electric charges accumulated in the gate input capacitance.

BRIEF DESCRIPTION OF THE DRAWINGS

FIGS. 1 to 10 are views showing a configuration of a semiconductor device in accordance with a preferred embodiment of the present invention;

FIG. 11 is a view showing the characteristic of a driving current of an IGBT 7 in the semiconductor device in accordance with the preferred embodiment of the present invention;

FIG. 12 is a view showing a configuration of a variation of the semiconductor device in accordance with the preferred embodiment of the present invention;

FIG. 14 is a view showing a configuration of a semiconductor device in the first background art;

FIG. 15 is a view showing the characteristic of the semiconductor device in the first background art;

FIG. 16 is a view showing a configuration of a semiconductor device in the second background art; and FIG. 17 is a view showing a configuration of a semiconductor device in the third background art.

DESCRIPTION OF THE PREFERRED EMBODIMENTS

Figure 1:
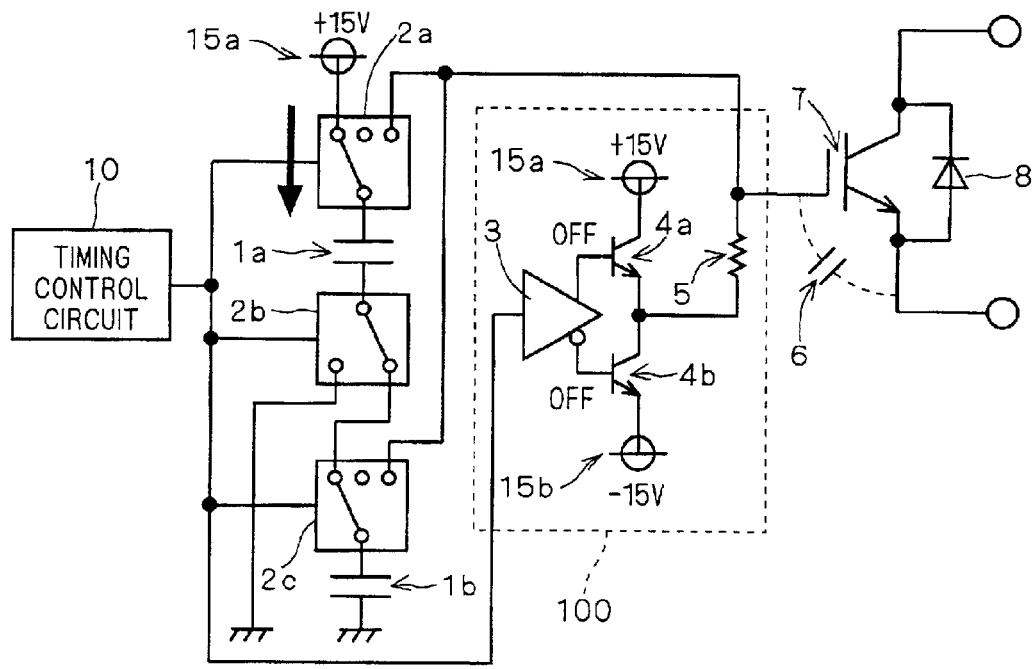

FIG. 1 is a view showing a configuration of a semiconductor device in accordance with the preferred embodiment of the present invention. As shown in FIG. 1, the semiconductor device of this preferred embodiment comprises the IGBT 7 which is an insulated gate transistor, the protection diode 8 working against a reverse voltage applied between the emitter and the collector of the IGBT 7, a driving unit 100 for driving the IGBT 7, semiconductor switches 2a to 2c, a timing control circuit 10 and capacitors 1a and 1b to be selectively connected the gate of the IGBT 7. The gate input capacitance 6 is parasitic capacitance generated structurally between the gate and the emitter of the IGBT 7.

The driving unit 100 comprises the gate driving circuit 3, the control power supply 15a which outputs a voltage of +15 V, the control power supply 15b which outputs a voltage of −15 V, the transistors 4a and 4b and the resistor 5. The gate driving circuit 3 has one input terminal and two output terminals. The input terminal is connected to the timing control circuit 10. Further, one of the output terminals of the gate driving circuit 3 is connected to a gate of the transistor 4a and the other is connected to a gate of the transistor 4b. The gate driving circuit 3 outputs two signals of different logical levels on the basis of a signal from the timing control circuit 10, to turn on the transistor 4a and off the transistor 4b or turn off the transistor 4a and on the transistor 4b. Furthermore, the gate driving circuit 3 brings its output terminals into high impedance, to turn off both the transistors 4a and 4b.

The collector of the transistor 4a is connected to the control power supply 15a and the emitter of the transistor 4b is connected to the control power supply 15b. An emitter of the transistor 4a and a collector of the transistor 4b are connected to each other. The emitter of the transistor 4a and the collector of the transistor 4b are connected through the resistor 5 to the gate of the IGBT 7.

The driving unit 100 having the above configuration drives the IGBT 7 by charging and discharging the gate input capacitance 6 of the IGBT 7. Specifically, when the gate driving circuit 3 turns the transistor 4a on and turns the transistor 4b off, the electric charges are supplied by the control power supply 15a to the gate input capacitance 6, thereby charging the gate input capacitance 6. When the gate driving circuit 3 turns the transistor 4a off and turns the transistor 4b on, the electric charges accumulated in the gate input capacitance 6 are extracted by the control power supply 15b, thereby discharging the gate input capacitance 6.

The semiconductor switch 2a is connected to the control power supply 15a of the driving unit 100, the gate of the IGBT 7 and one end of the capacitor 1a. The semiconductor switch 2b is connected to the other end of the capacitor 1a, the semiconductor switch 2c and the ground. The semiconductor switch 2c is connected to the gate of the IGBT 7, one end of the capacitor 1b and the semiconductor switch 2b. Further, the other end of the capacitor 1b is connected to the ground. In this case, the capacitors 1a and 1b are controlled by the semiconductor switches 2a to 2c and linked to the charge and discharge of the gate input capacitance 6 produced by the driving unit 100 to be selectively connected to the gate of the IGBT 7.

The timing control circuit 10 is connected to the semiconductor switches 2a to 2c, and the semiconductor switches 2a to 2c are controlled by signals transmitted from the timing control circuit 10. Specifically, the semiconductor switch 2a connects one end of the capacitor 1a to the control power supply 15a, to the gate of the IGBT 7 or to neither the control power supply 15a nor the gate of the IGBT 7 on the basis of the signal from the timing control circuit 10. The semiconductor switch 2b connects the other end of the capacitor 1a to the ground or to the semiconductor switch 2c on the basis of the signal from the timing control circuit 10. The semiconductor switch 2c connects one end of the capacitor 1b to the semiconductor switch 2b, to the gate of the IGBT 7 or to neither the semiconductor switch 2b nor the gate of the IGBT 7 on the basis of the signal from the timing control circuit 10.

An anode of the protection diode 8 is connected to the emitter of the IGBT 7 and a cathode of the protection diode 8 is connected to the collector of the IGBT 7, whereby the diode 8 serves as a protection diode against the reverse voltage applied between the collector and emitter of the IGBT 7.

Next discussion will be made on an operation of the semiconductor device of this preferred embodiment, having the above configuration, referring to FIGS. 1 to 10. First, referring to FIG. 1, on the basis of a signal from the timing control circuit 10, the semiconductor switch 2a connects one end of the capacitor 1a to the control power supply 15a, the semiconductor switch 2b connects the other end of the capacitor 1a to the semiconductor switch 2c and the semiconductor switch 2c connects one end of the capacitor 1b to the semiconductor switch 2b. As a result, between the control power supply 15a and the ground, the capacitors 1a and 1b are connected in series to each other, thereby being charged. Further, at this time, the gate driving circuit 3 turns both the transistors 4a and 4b off on the basis of a signal from the timing control circuit 10.

Figure 2:
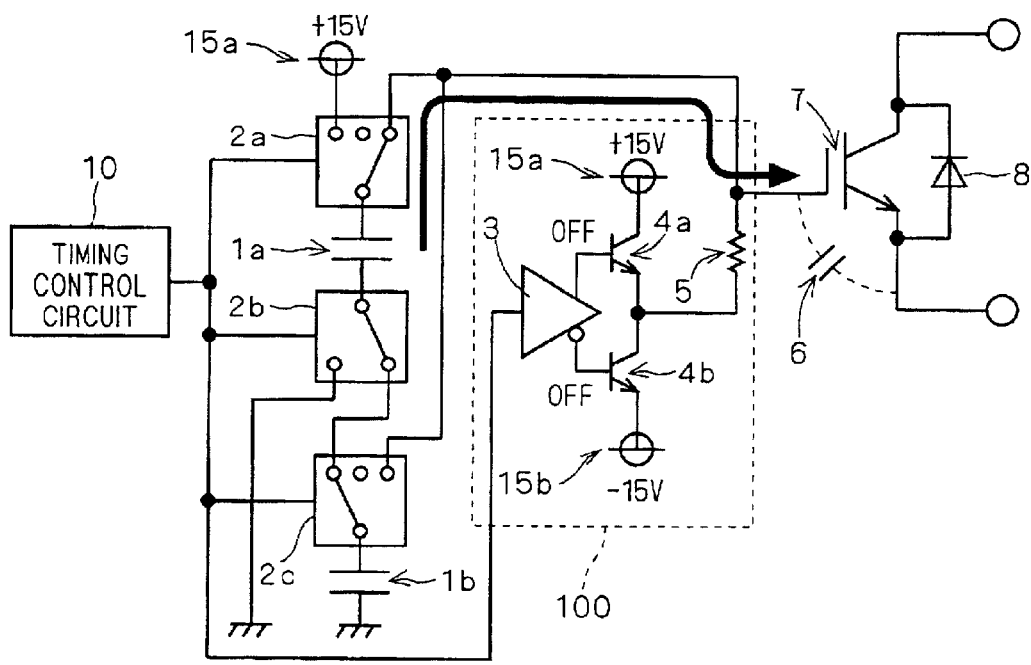

FIGS. 2 to 4 shows a process for charging the gate input capacitance 6 of the IGBT 7. Referring to FIG. 2, after the capacitors 1a and 1b are charged by the control power supply 15a, in order to charge the gate input capacitance 6 of the IGBT 7, the semiconductor switch 2a connects one end of the capacitor 1a to the gate of the IGBT 7 on the basis of a signal from the timing control circuit 10. With this connection, the capacitors 1a and 1b supply the gate input capacitance 6 of the IGBT 7 with part of the electric charges accumulated therein. Then, the gate input capacitance 6 accumulates the supplied electric charges. At this time, when the supply of the electric charges from the capacitors 1a and 1b to the gate input capacitance 6 is completed, the electric charges accumulated in the gate input capacitance 6 almost depends on the ratio of the composite capacitance of the capacitors 1a and 1b to the gate input capacitance 6. With the electric charges supplied by the capacitors 1a and 1b to the gate input capacitance 6, in other words, with the electric charges accumulated in the gate input capacitance 6, the gate voltage of the IGBT 7 increases. In this preferred embodiment, it is assumed that the gate voltage is, e.g., less than the threshold voltage when accumulation of the electric charges in the gate input capacitance 6 is completed and the IGBT 7 is not turned on with the electric charges accumulated in the gate input capacitance 6.

Next, referring to FIG. 3, after a predetermined time from the connection of the capacitor 1a to the gate of the IGBT 7, the semiconductor switch 2a disconnects the gate of the IGBT 7 from the capacitor 1a on the basis of a signal from the timing control circuit 10. At this time, this one end of the capacitor 1a is connected to neither the control power supply 15a nor the gate of the IGBT 7. Next, referring to FIG. 4, the driving unit 100 further supplies the gate input capacitance 6 with electric charges, thereby charging the gate input capacitance 6. Specifically, the gate driving circuit 3 turns only the transistor 4a on, on the basis of a signal from the timing control circuit 10. When the transistor 4a is turned on, a voltage of +15 V is supplied from the control power supply 15a to the gate of the IGBT 7. At this time, electric charges are supplied from the control power supply 15a to the gate input capacitance 6, thereby producing a gate current. Then, as the gate input capacitance 6 is being charged by the driving unit 100, the gate voltage of the IGBT 7 increases and when the gate voltage of the IGBT 7 becomes not less than the threshold voltage, the IGBT 7 is turned on. After that, when the charge of the gate input capacitance 6 is completed and the gate voltage of the IGBT 7 becomes about +15 V, the gate current almost stops flowing.

Figure 5:
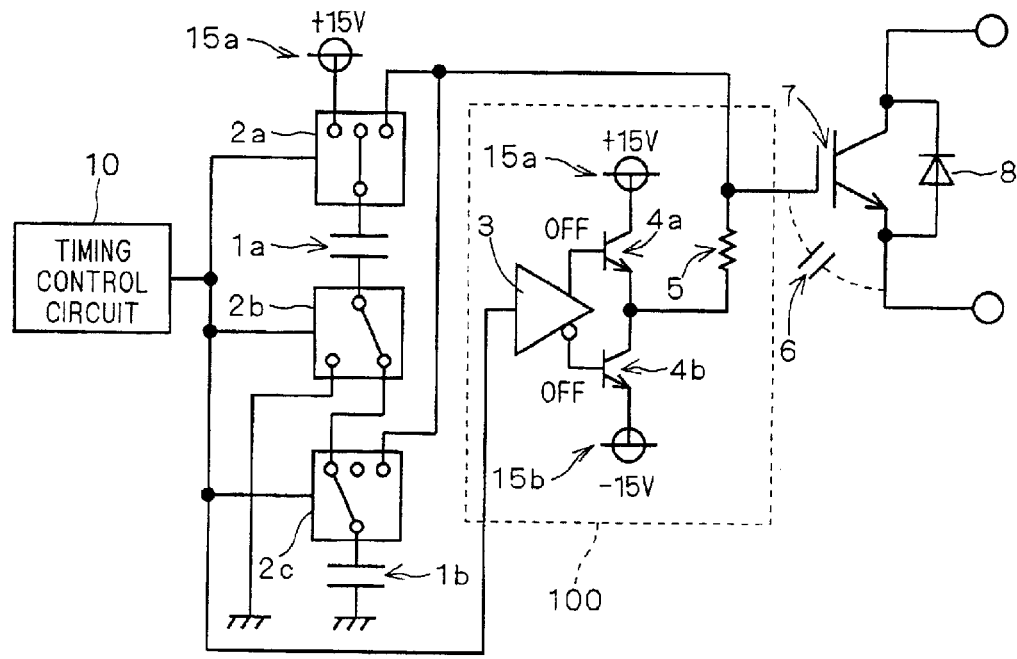

Next, referring to FIG. 5, the gate driving circuit 3 of the driving unit 100 turns the transistor 4a off on the basis of a signal from the timing control circuit 10. As a result, no voltage is applied to the gate of the IGBT 7.

Figure 6:
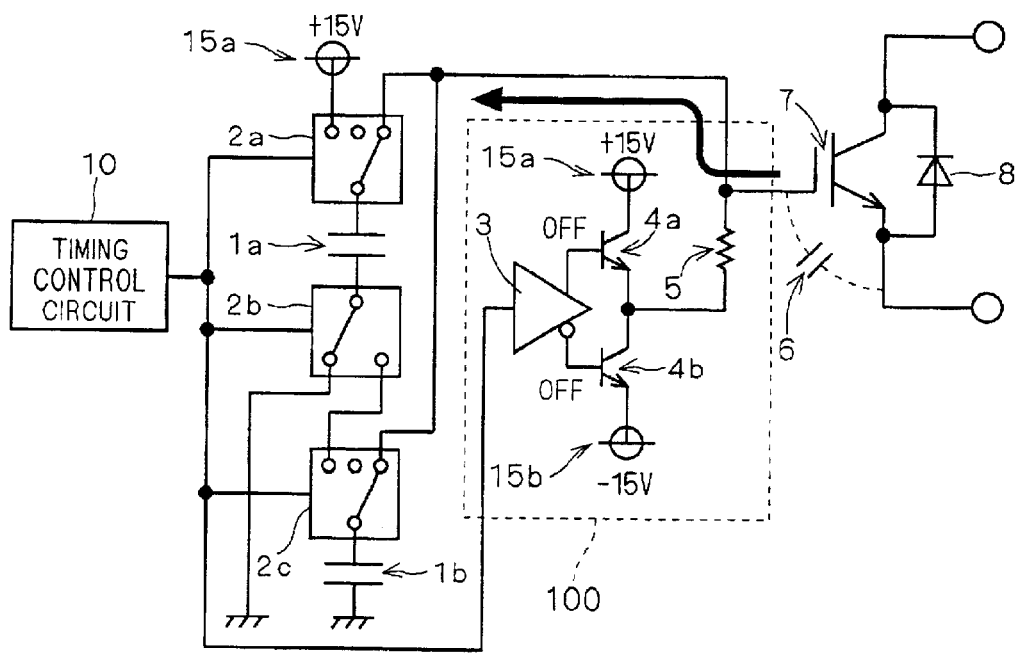
Figure 7:
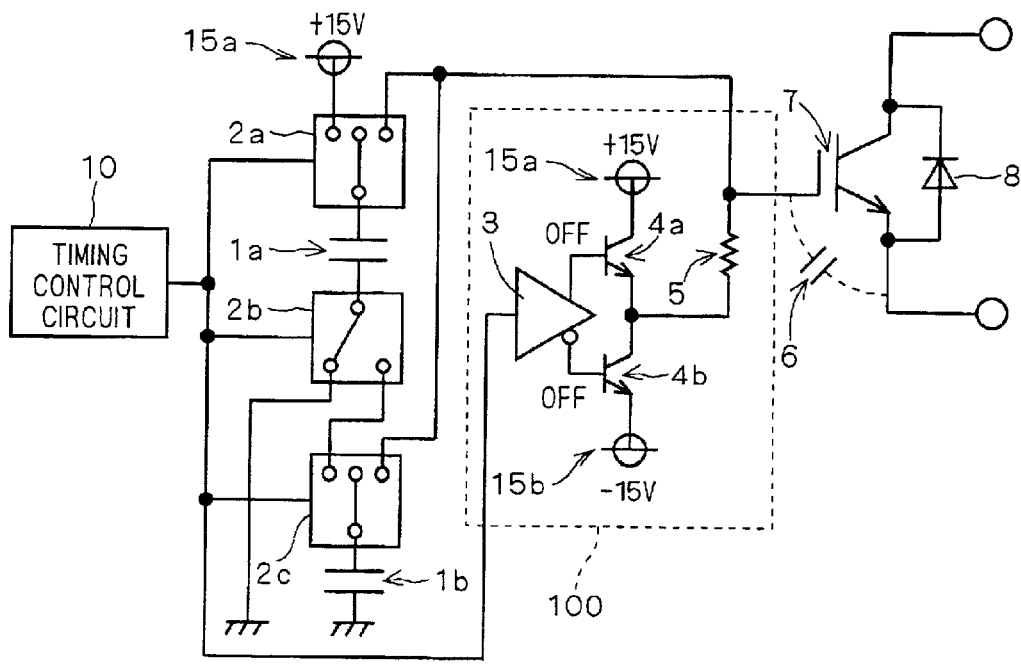
Figure 8:
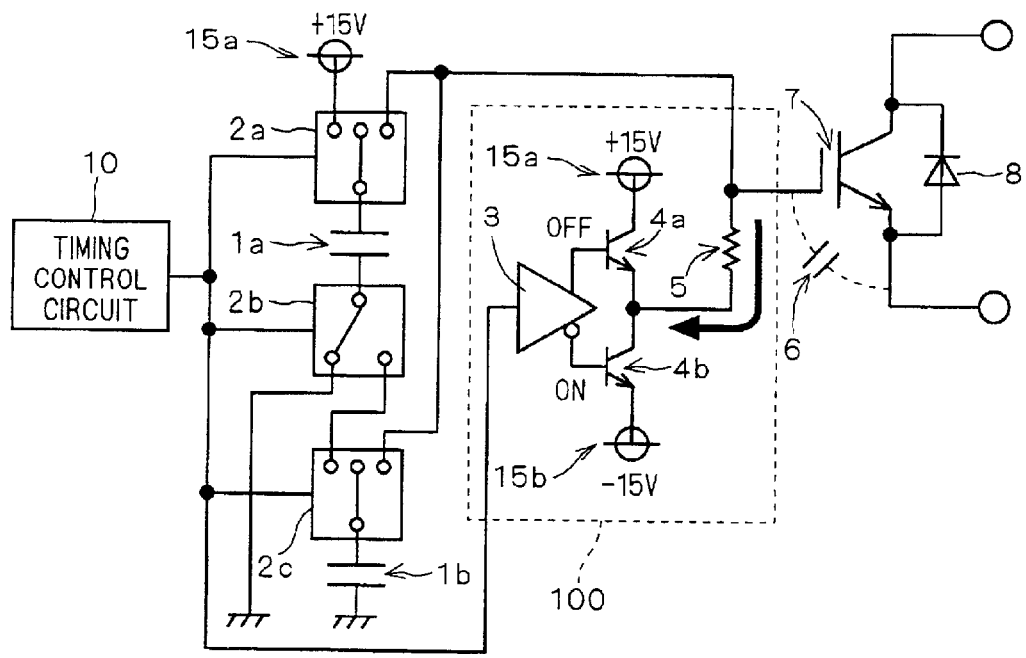

FIGS. 6 to 8 shows a process for discharging the gate input capacitance 6 of the IGBT 7. Referring to FIG. 6, after both the transistors 4a and 4b are turned off, in order to discharge the gate input capacitance 6, the semiconductor switch 2a connects one end of the capacitor 1a to the gate of the IGBT 7, the semiconductor switch 2b connects the other end of the capacitor 1a to the ground and the semiconductor switch 2c connects one end of the capacitor 1b to the gate of the IGBT 7, on the basis of signals from the timing control circuit 10. As a result, the capacitors 1a and 1b are connected in parallel to each other and both the respective one ends of the capacitors 1a and 1b are connected to the gate of the IGBT 7. Then, the gate input capacitance 6 supplies the capacitors 1a and 1b with part of the electric charges accumulated therein and the capacitors 1a and 1b accumulate the supplied electric charges therein. At this time, when the supply of the electric charges from the gate input capacitance 6 to the capacitors 1a and 1b is completed, the electric charges accumulated in the capacitors 1a and 1b almost depend on the ratio of the composite capacitance of the capacitors 1a and 1b to the gate input capacitance 6, like in the operation of the semiconductor device of this preferred embodiment discussed referring to FIG. 2. With the electric charges supplied by the gate input capacitance 6 to the capacitors 1a and 1b, the gate voltage of the IGBT 7 decreases. In this preferred embodiment, it is assumed that the gate voltage is, e.g., not less than the threshold voltage at this time and the IGBT 7 is not turned off by supplying the capacitors 1a and 1b with the electric charges accumulated in the gate input capacitance 6.

Next, referring to FIG. 7, after a predetermined time from the connection of the capacitors 1a and 1b to the gate of the IGBT 7, the semiconductor switch 2a disconnects the gate of the IGBT 7 from one end of the capacitor 1a and the semiconductor switch 2c disconnects the gate of the IGBT 7 from one end of the capacitor 1b, on the basis of signals from the timing control circuit 10. At this time, this one end of the capacitor 1a is connected to neither the control power supply 15a nor the gate of the IGBT 7, and one end of the capacitor 1b is connected to neither the semiconductor switch 2b nor the gate of the IGBT 7.

Next, referring to FIG. 8, the driving unit 100 extracts the electric charges remaining in the gate input capacitance 6, thereby discharging the gate input capacitance 6. Specifically, the gate driving circuit 3 turns only the transistor 4b on, on the basis of a signal from the timing control circuit 10. When the transistor 4b is turned on, a voltage of −15 V is supplied from the control power supply 15b to the gate of the IGBT 7. At this time, since the electric charges are accumulated in the gate input capacitance 6 of the IGBT 7, the accumulated electric charges are extracted by the control power supply 15b, thereby producing a gate current in a direction reverse to that in the case of turning on the IGBT 7. Then, as the gate input capacitance 6 is being discharged, the gate voltage of the IGBT 7 decreases and when the gate voltage of the IGBT 7 becomes less than the threshold voltage, the IGBT 7 is turned off. After that, when the discharge of the gate input capacitance 6 is completed and the gate voltage of the IGBT 7 becomes about −15 V, the gate current almost stops flowing.

Figure 9:
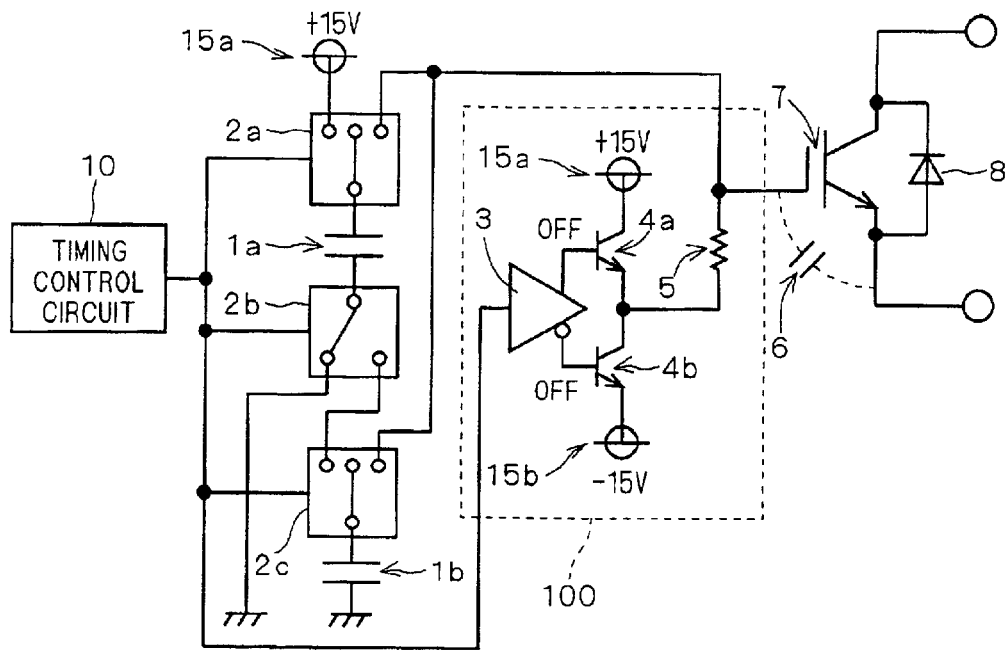
Figure 10:
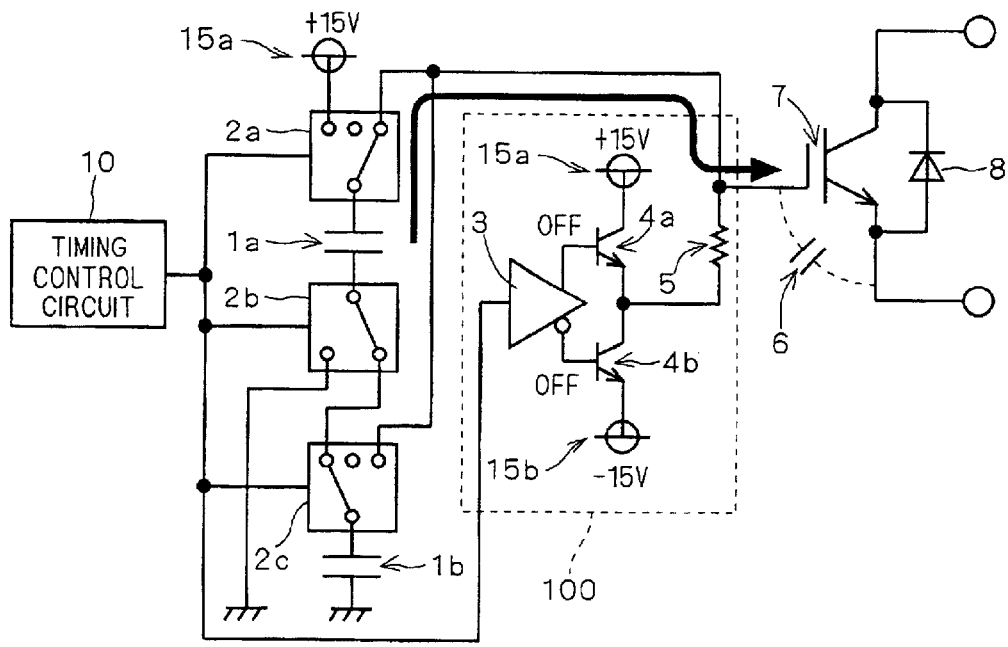

Next, referring to FIG. 9, the gate driving circuit 3 of the driving unit 100 turns the transistor 4b off on the basis of a signal from the timing control circuit 10. Then, referring to FIG. 10, when the semiconductor switch 2a connects one end of the capacitor 1a which accumulates the electric charges supplied from the gate input capacitance 6 to the gate of the IGBT 7 on the basis of a signal from the timing control circuit 10, the capacitors 1a and 1b supply the gate input capacitance 6 of the IGBT 7 with part of the electric charges accumulated therein. The gate input capacitance 6 accumulates the supplied electric charges therein. With the electric charges accumulated in the gate input capacitance 6, the gate voltage of the IGBT 7 increases, but in this preferred embodiment, it is assumed that the gate voltage is, e.g., less than the threshold voltage at this time and the IGBT 7 is not turned on with the electric charges accumulated in the gate input capacitance 6. After that, in the semiconductor device of this preferred embodiment, by repeating the operation as discussed above referring to FIGS. 3 to 10 is repeated, the IGBT 7 performs a switching operation. Further, a series of processes shown in FIGS. 10, 3 and 4 corresponds to the process for charging the gate input capacitance 6, like the processes shown in FIGS. 2 to 4.

In the semiconductor device of this preferred embodiment performing the above-discussed operation, when the driving unit 100 discharges the gate input capacitance 6 of the IGBT 7 (see FIG. 8), the capacitors 1a and 1b are connected to the gate of the IGBT 7 in advance of the discharge, whereby the gate input capacitance 6 supplies part of the electric charges accumulated therein to the capacitors 1a and 1b and the capacitors 1a and 1b accumulate therein the supplied electric charges (see FIG. 6). Then, when the driving unit 100 charges the gate input capacitance 6 (see FIG. 4), the capacitor 1a is connected to the gate of the IGBT 7 in advance of the charge, whereby the capacitors 1a and 1b supply the gate input capacitance 6 with part of the electric charges which are supplied from the gate input capacitance 6 and accumulated therein and the gate input capacitance 6 accumulates the supplied electric charges therein (see FIG. 10). In other words, when the driving unit 100 charges the gate input capacitance 6, the gate input capacitance 6 eventually accumulates part of the electric charges which are accumulated therein at the time of the discharge of the gate input capacitance 6 produced by the driving unit 100. For this reason, since the electric charges are accumulated in the gate input capacitance 6 to some degree when the driving unit 100 begins charging the gate input capacitance 6, it is possible to reduce the amount of electric charges to be supplied to the gate input capacitance 6 by the driving unit 100 until the charge of the gate input capacitance 6 is completed. As a result, it is possible to reduce the required power capacity of the control power supply 15a to allow the driving unit 100 to supply the gate input capacitance 6 with the electric charges.

Further, as to the control power supply 15b, since part of the electric charges accumulated in the gate input capacitance 6 after the IGBT 7 is turned on are accumulated in the capacitors 1a and 1b when the driving unit 100 begins discharging the gate input capacitance 6, it is possible to reduce the amount of electric charges to be drained to the control power supply 15b. As a result, it is possible to reduce the required power capacity of the control power supply 15b.

Furthermore, in this preferred embodiment, unlike the above-discussed second background art, since part of the electric charges which are accumulated in the gate input capacitance 6 when the gate input capacitance 6 of the IGBT 7 is discharged are used to charge the gate input capacitance 6, in other words, the electric charges accumulated in the gate input capacitance 6 are effectively utilized, it is possible to ensure power savings in the semiconductor device.

Furthermore, in this preferred embodiment, unlike the above-discussed third background art, it is not necessary to operate the IGBT 7 always with a constant switching frequency in order to effectively use the electric charges accumulated in the gate input capacitance 6 and it is therefore possible to ensure power savings in the semiconductor device even when the IGBT 7 is operated with an arbitrary switching frequency.

FIG. 11 is a view showing a relation between a driving current I2 of the IGBT 7 in this preferred embodiment and a driving current I1 of the IGBT 7 in the first background art. The driving currents I1 and I2 shown in FIG. 11 are the gate currents supplied from the control power supply 15a when the IGBT 7 is turned on. As shown in FIG. 11, in the semiconductor device of this preferred embodiment, the peak value of the driving current of the IGBT 7 and the total amount of the driving currents flowing until the IGBT 7 is turned on are reduced as compared with those of the first background art. This suggests that it is possible to reduce the required power capacity of the control power supply 15a and ensure power savings in the semiconductor device.

Further, in this preferred embodiment, though the timing control circuit 10, the semiconductor switches 2a to 2c and the capacitors 1a and 1b are added to the configuration of the above first background art, these additional circuits can be achieved by using integrated circuits. The physical size of the control power supplies 15a and 15b mainly depends on a switching transformer and an electrolytic condenser. In this preferred embodiment, since the required power capacity of the control power supplies 15a and 15b can be reduced, it is possible to reduce the physical size of the switching transformer and the electrolytic condenser. A decrease in size of the switching transformer and the electrolytic condenser usually has a greater effect on the physical size of the semiconductor device on the whole than an increase in size by the additional circuits. For this reason, since the required power capacity of the control power supplies 15a and 15b can be reduced in the semiconductor device of this preferred embodiment, it is possible to reduce the size of the semiconductor device on the whole.

Furthermore, a decrease in physical size of the switching transformer and the electrolytic condenser usually has a greater effect on the cost of the semiconductor device on the whole than an increase in size by the additional circuits. In the semiconductor device of this preferred embodiment, since the required power capacity of the control power supplies 15a and 15b can be reduced in the semiconductor device of this preferred embodiment, it is possible to reduce the cost of the semiconductor device on the whole.

In this preferred embodiment, since the gate input capacitance 6 is charged by the capacitors 1a and 1b, if the capacitors 1a and 1b are regarded as a kind of power supply, the output impedance of this power supply is usually lower than the output impedance of the driving unit 100. Since the capacitors 1a and 1b supply the gate input capacitance 6 with the electric charges accumulated therein in advance of the charge of the gate input capacitance 6 produced by the driving unit 100, in other words, since the initial charge of the gate input capacitance 6 is produced by the capacitors 1a and 1b, the rise time of the gate voltage of the IGBT 7 can be reduced as compared with the first background art where all the charges of the gate input capacitance 6 are produced by the control power supply 15a. Therefore, the switching operation of the IGBT 7 becomes faster than that in the first background art.

Further, though the link of the connection between the gate of the IGBT 7 and the capacitors 1a and 1b to the discharge of the gate input capacitance 6 produced by the driving unit 100 is established by connecting the capacitors 1a and 1b to the gate of the IGBT 7 in advance of the discharge of the gate input capacitance 6 produced by the driving unit 100 (see FIG. 6) in this preferred embodiment, the link of the connection between the gate of the IGBT 7 and the capacitors 1a and 1b to the discharge of the gate input capacitance 6 produced by the driving unit 100 may be established by connecting the capacitors 1a and 1b to the gate of the IGBT 7 on the way of discharging the gate input capacitance 6 by the driving unit 100. Furthermore, though the link of the connection between the gate of the IGBT 7 and the capacitor 1a to the charge of the gate input capacitance 6 produced by the driving unit 100 is established by connecting the capacitor 1a to the gate of the IGBT 7 in advance of the charge of the gate input capacitance 6 produced by the driving unit 100 (see FIGS. 2 and 10) in this preferred embodiment, the link of the connection between the gate of the IGBT 7 and the capacitor 1a to the charge of the gate input capacitance 6 produced by the driving unit 100 may be established by connecting the capacitor 1a to the gate of the IGBT 7 on the way of charging the gate input capacitance 6 by the driving unit 100.

Specifically, for example, the driving unit 100 discharges the gate input capacitance 6, and when the gate voltage decreases till near the threshold voltage, both the transistors 4a and 4b are turned off to stop the discharge. Then, when the capacitors 1a and 1b are connected to the gate of the IGBT 7, the gate input capacitance 6 supplies the capacitors 1a and 1b with part of the electric charges accumulated therein. When the supply of the electric charges to the capacitors 1a and 1b is completed, the capacitors 1a and 1b are disconnected from the gate of the IGBT 7 and the driving unit 100 produces the discharge of the gate input capacitance 6 again until it is completed.

Further, the driving unit 100 charges the gate input capacitance 6, and when the gate voltage increases till near the threshold voltage, both the transistors 4a and 4b are turned off to stop the charge. Then, when the capacitor 1a which is connected in series to the capacitor 1b is connected to the gate of the IGBT 7, the capacitors 1a and 1b supply the gate input capacitance 6 with part of the electric charges accumulated therein and the gate input capacitance 6 accumulates therein the supplied electric charges. When the accumulation of the electric charges into the gate input capacitance 6 is completed, the capacitor 1a is disconnected from the gate of the IGBT 7 and the driving unit 100 produces the charge of the gate input capacitance 6 again until it is completed.

In the case where the electric charges accumulated in the gate input capacitance 6 are supplied to the capacitors 1a and 1b on the way of discharging the gate input capacitance 6 by the driving unit 100, however, since part of the electric charges of the gate input capacitance 6 are extracted by the driving unit 100, it is not possible to supply a sufficient amount of electric charges to the capacitors 1a and 1b as compared with the case of this preferred embodiment. In other words, in this preferred embodiment, since part of the electric charges accumulated in the gate input capacitance 6 are supplied to the capacitors 1a and 1b in advance of the discharge of the gate input capacitance 6 produced by the driving unit 100, it is possible to supply a sufficient amount of electric charges to the capacitors 1a and 1b. Therefore, the capacitors 1a and 1b can accumulate a sufficient amount of electric charges, and when the driving unit 100 begins charging the gate input capacitance 6, a sufficient amount of electric charges can be accumulated in the gate input capacitance 6. As a result, it is possible to surely reduce the amount of electric charges to be supplied to the gate input capacitance 6 by the driving unit 100 until the charge of the gate input capacitance 6 is completed and therefore the required power capacity of the control power supply 15a can be surely reduced.

Further, in the case where the gate input capacitance 6 accumulates the electric charges supplied from the capacitors 1a and 1b on the way of charging the gate input capacitance 6 by the driving unit 100, however, since the gate input capacitance 6 are supplied with the electric charges by the driving unit 100, it is not possible to accumulate a sufficient amount of electric charges supplied from the capacitors 1a and 1b in the gate input capacitance 6 as compared with the case of this preferred embodiment. In other words, in this preferred embodiment, since the gate input capacitance 6 accumulates the electric charges supplied from the capacitors 1a and 1b in advance of the charge of the gate input capacitance 6 produced by the driving unit 100, it is possible to accumulate a sufficient amount of electric charges supplied from the capacitors 1a and 1b in the gate input capacitance 6. Therefore, when the driving unit 100 begins charging the gate input capacitance 6, sufficient amount of electric charges are accumulated in the gate input capacitance 6. As a result, it is possible to surely reduce the amount of electric charges to be supplied to the gate input capacitance 6 by the driving unit 100 until the charge of the gate input capacitance 6 is completed and therefore the required power capacity of the control power supply 15a can be surely reduced.

In the above-discussed preferred embodiment, referring to FIG. 3, in the case of turning on the IGBT 7, though the gate of the IGBT 7 is disconnected from the capacitor 1a after a predetermined time from the connection between the capacitor 1a and the gate of the IGBT 7, it is desirable that this predetermined time should be not more than 5 $\mu$s. In other words, it is desirable that the time period from the connection of the gate of the IGBT 7 to the capacitor 1a (see FIGS. 2 and 10) to the disconnection of the gate of the IGBT 7 from the capacitor 1a (see FIG. 3) should be not more than 5 $\mu$s. Further, in the above-discussed preferred embodiment, referring to FIG. 7, in the case of turning off the IGBT 7, though the gate of the IGBT 7 is disconnected from the capacitors 1a and 1b after a predetermined time from the connection between the capacitors 1a and 1b and the gate of the IGBT 7, it is also desirable that this predetermined time should be not more than 5 $\mu$s. In other words, it is desirable that the time period from the connection of the gate of the IGBT 7 to the capacitors 1a and 1b (see FIG. 6) to the disconnection of the gate of the IGBT 7 from the capacitors 1a and 1b (see FIG. 7) should be not more than 5 $\mu$s.

The switching frequency fc of the IGBT 7 is usually about 2 to 20 kHz, and the requirements specification on the rise time or the fall time of the gate voltage of the IGBT 7 in a switching operation is not more than 5 $\mu$s. Accordingly, by setting the time period from the connection of the gate of the IGBT 7 to the capacitor 1a to the disconnection of the gate of the IGBT 7 from the capacitor 1a to be not more than 5 $\mu$s, it is possible to approximate the rise time of the gate voltage of the IGBT 7 in the switching operation to the requirements specification. Also by setting the time period from the connection of the gate of the IGBT 7 to the capacitors 1a and 1b to the disconnection of the gate of the IGBT 7 from the capacitors 1a and 1b to be not more than 5 $\mu$s, it is possible to approximate the fall time of the gate voltage of the IGBT 7 in the switching operation to the requirements specification.

In this preferred embodiment, referring to FIG. 2, the gate input capacitance 6 accumulates the electric charges supplied from the capacitors 1a and 1b in advance of being charged by the driving unit 100. Therefore, the gate voltage of the IGBT 7 increases but the gate voltage becomes less than the threshold voltage when the accumulation of the electric charges in the gate input capacitance 6 is completed. In other words, the IGBT 7 is not turned on with this gate voltage. In order to ensure power savings, however, it is desirable that the gate voltage of the IGBT 7 should become not less than the threshold voltage with the electric charges supplied by the capacitors 1a and 1b to the gate input capacitance 6.

Further, in this preferred embodiment, referring to FIG. 6, the gate input capacitance 6 supplies the capacitors 1a and 1b with part of the electric charges accumulated therein in advance of being discharged by the driving unit 100. Therefore, the gate voltage of the IGBT 7 decreases but the gate voltage becomes not less than the threshold voltage after the supply of the electric charges by the gate input capacitance 6 to the capacitors 1a and 1b. In other words, the IGBT 7 is not turned off with the gate voltage. In order to ensure power savings, however, it is desirable that the gate voltage should become less than the threshold voltage by supplying part of the electric charges accumulated in the gate input capacitance 6 to the capacitors 1a and 1b.

Usually, not less than about 95% of the total amount of charging currents of the IGBT 7 is the total amount of gate currents after the gate input capacitance 6 begins increasing by the Miller effect of the IGBT 7. Since the Miller effect is caused by turning on the IGBT 7, the gate input capacitance 6 accumulates the electric charges supplied from the capacitors 1a and 1b and the gate voltage of the IGBT 7 becomes not less than the threshold voltage, to compensate most of the charging currents with the electric charges accumulated in the capacitors 1a and 1b. Therefore, the gate voltage of the IGBT 7 becomes not less than the threshold voltage with the electric charges supplied from the capacitors 1a and 1b to the gate input capacitance 6, to thereby ensure further power savings.

Further, like the charging currents, most of the total amount of discharging currents of the IGBT 7 is usually the total amount of gate currents flowing while the Miller effect occurs in the IGBT 7, in other words, until the IGBT 7 is turned off. Therefore, part of the electric charges accumulated in the gate input capacitance 6 is supplied to the capacitors 1a and 1b and the gate voltage becomes less than the threshold voltage, to thereby accumulate most of the discharging currents in the capacitors 1a and 1b. Thus, since the electric charges accumulated in the gate input capacitance 6 can be effectively used, it is possible to ensure further power savings.

In order to achieve the above conditions, for example, the capacitances of the capacitors 1a and 1b should be each set to be twice as much as the gate input capacitance 6 at the time when the Miller effect occurs. In this preferred embodiment, with this setting, when the capacitors 1a and 1b are supplied with the electric charges accumulated in the gate input capacitance 6 and accumulates the supplied electric charges therein (see FIG. 6) after the charge of the gate input capacitance 6 of the IGBT 7 is completed by the driving unit 100 (see FIG. 4), the composite capacitance of the capacitors 1a and 1b which are connected in parallel to each other becomes four times as much as the gate input capacitance 6 at the time when the Miller effect occurs. Therefore, even if suppose that the Miller effect occurs even when the IGBT 7 is turned off, when the supply of the electric charges from the gate input capacitance 6 is completed, the gate voltage of the IGBT 7 becomes 3 V. Since the threshold voltage for the gate voltage is usually about 6 V, by supplying part of the electric charges accumulated in the gate input capacitance 6 to the capacitors 1a and 1b, the gate voltage becomes less than the threshold voltage.

Further, though the electric charges accumulated in the capacitors 1a and 1b are supplied to the gate input capacitance 6 (see FIG. 10) after the discharge of the gate input capacitance 6 of the IGBT 7 is completed by the driving unit 100 (see FIG. 8) in this preferred embodiment, the capacitors 1a and 1b may be always charged by the control power supply 15a after the discharge of the gate input capacitance 6 of the IGBT 7 is completed by the driving unit 100. Specifically, as discussed with reference to FIG. 1, the capacitor 1a is connected to the control power supply 15a and the capacitors 1a and 1b are connected in series to each other between the control power supply 15a and the ground. Thus, since the electric charges accumulated in the capacitors 1a and 1b are supplied to the gate input capacitance 6 after the capacitors 1a and 1b are charged and the capacitors 1a and 1b are connected in series to each other when the gate input capacitance 6 accumulates the supplied electric charges, the composite capacitance of the capacitors 1a and 1b are equal to the gate input capacitance 6 at the time when the Miller effect occurs. Therefore, when the accumulation of the electric charges in the gate input capacitance 6 is completed, the gate voltage of the IGBT 7 becomes 7.5 V. Since the threshold voltage for the gate voltage is usually about 6 V, as mentioned above, the gate voltage of the IGBT 7 becomes not less than the threshold voltage with the electric charges supplied from the capacitors 1a and 1b to the gate input capacitance 6.

Furthermore, in order only to make the gate voltage less than the threshold voltage, it is only necessary to set the composite capacitance of the capacitors 1a and 1b to be not less than twice as much as the gate input capacitance 6 at the time when the Miller effect occurs, and then the gate voltage becomes less than the threshold voltage by supplying part of the electric charges accumulated in the gate input capacitance 6 to the capacitors 1a and 1b. Specifically, even if suppose that the Miller effect occurs even when the IGBT 7 is turned off, when the supply of the electric charges from the gate input capacitance 6 is completed, the gate voltage of the IGBT 7 becomes not more than 5 V, in other words, less than the threshold voltage for the gate voltage.

In the switching operation of the IGBT 7, when the IGBT 7 is turned on by accumulating the electric charges supplied from the capacitors 1a and 1b in the gate input capacitance 6 and the IGBT 7 is turned off by supplying part of the electric charges accumulated in the gate input capacitance 6 to the capacitors 1a and 1b, the equivalent gate input capacitance 6 of the IGBT 7 increases since the gate of the IGBT 7 is connected to the capacitors 1a and 1b. Therefore, it is possible to reduce variation of the gate voltage caused by variation of a collector voltage which is generated when the IGBT 7 is turned on/off. As a result, it is possible to provide a semiconductor device performing a stable operation.

Figure 13:
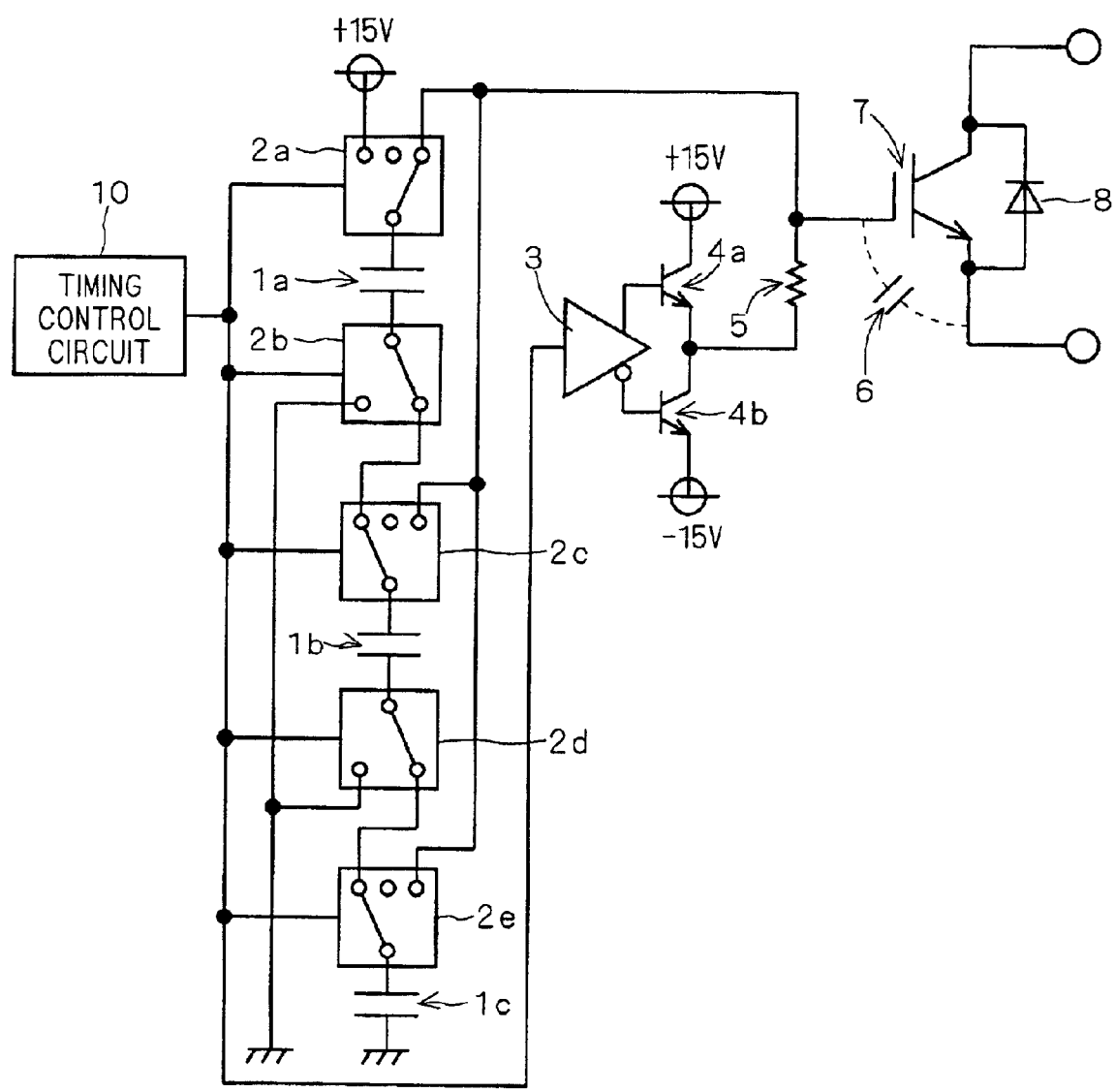
FIG. 13 is a view showing a configuration of another variation of the semiconductor device in accordance with the preferred embodiment of the present invention.

Though two capacitors 1a and 1b are used as capacitors for accumulating the electric charges accumulated in the gate input capacitance 6 in this preferred embodiment, a semiconductor device using only one capacitor as shown in FIG. 12 or a semiconductor device using three capacitors as shown in FIG. 13 can perform the same operation as that of this preferred embodiment by appropriately controlling the semiconductor switches 2a to 2e and the gate driving circuit 3 with the timing control circuit 10.

Further, though the capacitors 1a and 1b are connected in series to each other when the gate input capacitance 6 is charged by the driving unit 100 and the capacitors 1a and 1b are connected in parallel to each other when the gate input capacitance 6 is discharged by the driving unit 100 in this preferred embodiment, selection may be made on whether series connection or parallel connection according to the requirements specification of the semiconductor device.

Furthermore, though the capacitor 1a is connected to the control power supply 15a for supplying the gate input capacitance 6 with the electric charges and the capacitor 1b is connected to the ground in this preferred embodiment, the capacitors 1a and 1b may be connected to a constant-voltage power supply different from the control power supply 15a.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   an insulated gate transistor;
   a driving unit for producing charge and discharge of gate input capacitance of said insulated gate transistor; and
   at least one capacitor linked to said charge and said discharge produced by said driving unit to be selectively connected to a gate of said insulated gate transistor,
   wherein said at least one capacitor is linked to said discharge produced by said driving unit to be connected to said gate, whereby said gate input capacitance supplies said at least one capacitor with electric charges accumulated therein and said at least one capacitor accumulates therein said electric charges supplied from said gate input capacitance, and said at least one capacitor is linked to said charge produced by said driving unit to be connected to said gate, whereby said at least one capacitor supplies said gate input capacitance with said electric charges accumulated therein and said gate input capacitance accumulates therein said electric charges supplied from said at least one capacitor.

2. The semiconductor device according to claim 1, wherein said at least one capacitor is connected to said gate in advance of said discharge produced by said driving unit and said gate input capacitance supplies said electric charges accumulated therein to said at least one capacitor.

3. The semiconductor device according to claim 1, wherein said at least one capacitor is connected to said gate in advance of said charge produced by said driving unit and said gate input capacitance accumulates therein said electric charges supplied by said at least one capacitor.

4. The semiconductor device according to claim 2, wherein said at least one capacitor is connected to said gate in advance of said charge produced by said driving unit and said gate input capacitance accumulates therein said electric charges supplied by said at least one capacitor.

5. The semiconductor device according to claim 1, wherein a gate voltage of said insulated gate transistor becomes not less than a threshold voltage with said electric charges supplied to said gate input capacitance by said at least one capacitor.

6. The semiconductor device according to claim 1, wherein a gate voltage of said insulated gate transistor becomes less than a threshold voltage by supplying said at least one capacitor with said electric charges accumulated in said gate input capacitance.

7. The semiconductor device according to claim 5, wherein a gate voltage of said insulated gate transistor becomes less than a threshold voltage by supplying said at least one capacitor with said electric charges accumulated in said gate input capacitance.

8. The semiconductor device according to claim 1, wherein the capacitance of said at least one capacitor is not less than twice as much as said gate input capacitance at the time when the Miller effect occurs.

9. The semiconductor device according to claim 1, wherein said at least one capacitor consists of a plurality of capacitors, and said plurality of capacitors are connected in parallel to one another when said electric charges accumulated in said gate input capacitance are supplied thereto and the plurality of capacitors are connected in series to one another when said electric charges accumulated therein are supplied to said gate input capacitance.

10. A method of driving a transistor, comprising the steps of:
    (a) producing discharge of gate input capacitance in an insulated gate transistor; and
    (b) producing charge of said gate input capacitance,
    wherein said step (a) includes the steps of:
      (c) supplying electric charges accumulated in said gate input capacitance to said capacitor and accumulating said electric charges supplied by said gate input capacitance in said capacitor; and
      (d) extracting electric charges remaining in said gate input capacitance after said step (c), and
    said step (b) includes the steps of:
      (e) supplying electric charges accumulated in said capacitor to said gate input capacitance and accumulating said electric charges supplied by said capacitor in said gate input capacitance after said step (d); and
      (f) further supplying electric charges to said gate input capacitance after said step (e).

11. The method of driving a transistor according to claim 10, further comprising the step of:
    (g) charging said capacitor after said step (a) and before said step (b).

12. The method of driving a transistor according to claim 10, wherein
    said gate input capacitance supplies said electric charges accumulated therein to said capacitor after a gate of said insulated gate transistor and said capacitor are connected to each other in said step (c),
    said electric charges remaining in said gate input capacitance are extracted in said step (d) after said gate and said capacitor are disconnected from each other in said step (c),
    said capacitor supplies said electric charges accumulated therein to said gate input capacitance after said gate and said capacitor are connected to each other in said step (e), and
    said electric charges are further supplied to said gate input capacitance in said step (f) after said gate and said capacitor are disconnected from each other in said step (e).

13. The method of driving a transistor according to claim 12, wherein
    a time period from connection of said gate to said capacitor in said step (c) to disconnection of said gate from said capacitor in said step (d) is not more than 5 .mu.s.

14. The method of driving a transistor according to claim 12, wherein
    a time period from connection of said gate to said capacitor in said step (e) to disconnection of said gate from said capacitor in said step (f) is not more than 5 .mu.s.

15. The method of driving a transistor according to claim 13, wherein
    a time period from connection of said gate to said capacitor in said step (e) to disconnection of said gate from said capacitor in said step (f) is not more than 5 .mu.s.

* * * * *